United States Patent [19]

Roger

[11] 4,315,271
[45] Feb. 9, 1982

[54] POWER TRANSISTOR AND METHOD OF MANUFACTURING SAME

[75] Inventor: Bernard Roger, Carpiquet, France

[73] Assignee: U.S. Philips Corporation, New York, N.Y.

[21] Appl. No.: 134,395

[22] Filed: Mar. 27, 1980

Related U.S. Application Data

[63] Continuation of Ser. No. 859,602, Dec. 12, 1977, abandoned.

[30] Foreign Application Priority Data

Dec. 20, 1976 [FR] France .............................. 76 38303

[51] Int. Cl.³ ........................................... H01L 29/06
[52] U.S. Cl. ....................................... 357/20; 357/13; 357/34; 357/36; 357/38; 357/86; 357/89
[58] Field of Search ....................... 357/20, 34, 38, 36, 357/86, 89, 13

[56] References Cited

U.S. PATENT DOCUMENTS

| | | | |
|---|---|---|---|
| 3,300,694 | 1/1967 | Stehney et al. | 357/20 |
| 3,337,783 | 8/1967 | Stehney | 357/86 |
| 3,432,733 | 3/1969 | Eugster | 357/86 |
| 3,617,828 | 11/1971 | Danilok | 357/86 |
| 3,641,403 | 2/1972 | Nakata | 357/38 |
| 3,896,477 | 7/1975 | Hutson | 357/86 |
| 4,100,561 | 7/1978 | Ollendorf | 357/86 |

OTHER PUBLICATIONS

J. Gillett, "Power Transistors Having Increased Reverse Bias Safe Operating Area", IBM Tech. Discl. Bull., vol. 16, #11, Apr. 1974, p. 3642.

*Primary Examiner*—Joseph E. Clawson, Jr.
*Attorney, Agent, or Firm*—Thomas A. Briody; Robert T. Mayer; Steven R. Biren

[57] ABSTRACT

A multilayer power transistor includes an emitter zone having two layers of different doping levels, a less highly doped layer and a more highly doped surface region. The base zone of the transistor includes a central base region of higher doping level than that of the remainder of the base zone and which extends into the emitter surface region. This configuration results in a structure which exhibits a defocalization effect at any current level and improved secondary breakdown characteristics.

4 Claims, 4 Drawing Figures

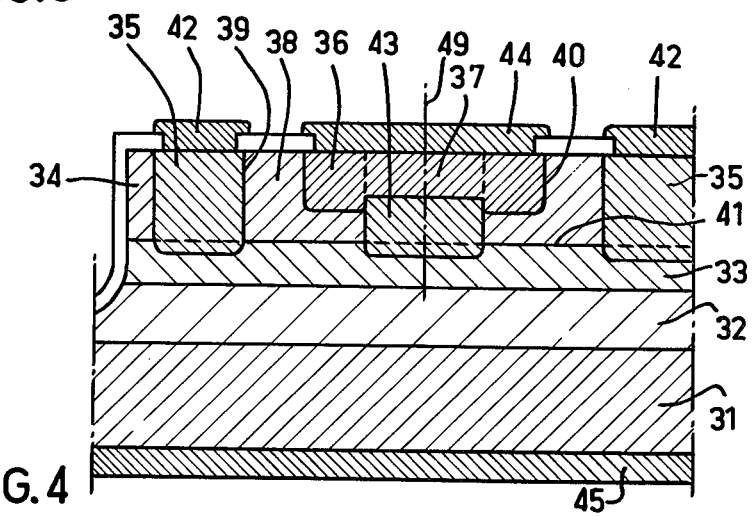
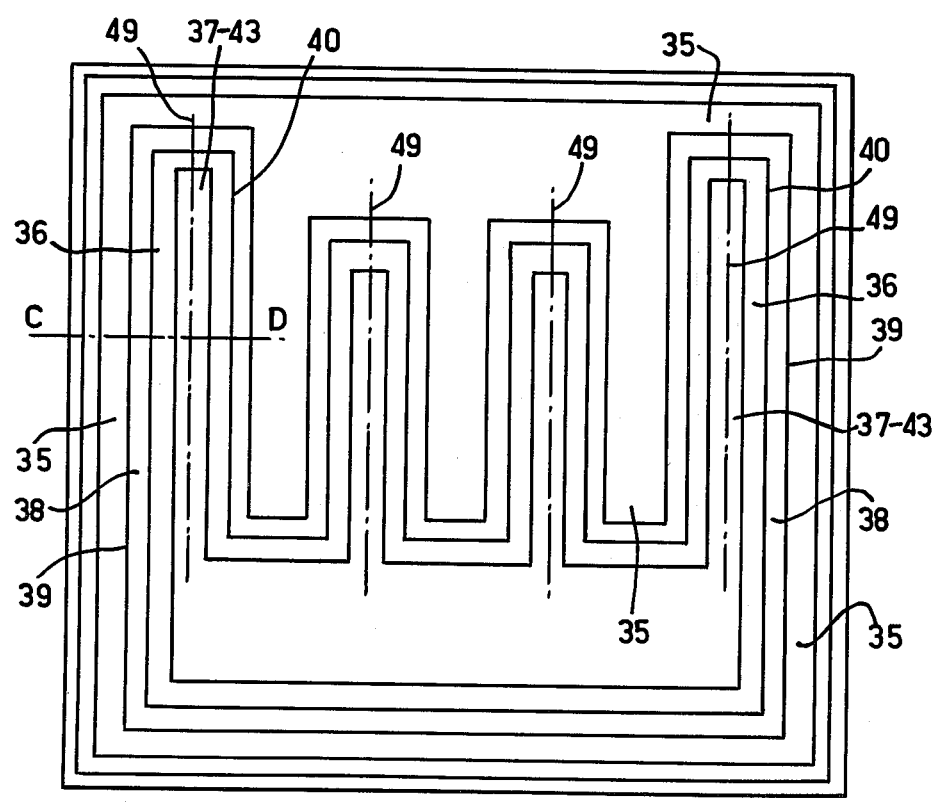

POWER TRANSISTOR AND METHOD OF MANUFACTURING SAME

This is a continuation of application Ser. No. 859,602, filed Dec. 12, 1977 now abandoned.

The invention relates to a transistor having a semiconductor body comprising a first semiconductor layer of a first conductivity type forming at least a part of the collector zone of the transistor, a second layer of the second conductivity type which adjoins same and which forms the base zone, an emitter zone which is formed by a part of a third semiconductor layer of the first conductivity type which adjoins the second layer, and a more highly doped surface region of the first conductivity type present therein, the said part of the third layer being bounded by a highly doped base contact zone connecting the second layer to the surface, the said surface region being situated at a distance from the base contact zone.

Transistors are known having a low-doped emitter zone in which the emitter zone is formed by two regions, namely a first low-doped region adjoining the base zone, and a highly doped surface region adjoining the emitter electrode and being situated in the said first region. Such a structure shows two emitter regions which form, for example, a N+/N junction in the case of an npn transistor, which junction confers a good emitter efficiency and an advantageous current amplification on the transistor notwithstanding the low doping of the emitter zone at the emitter-base junction. This type of transistor is described, for example, in French patent specification No. 2,266,307. However, said transistors remain sensitive to what is termed secondary breakdown or thermal avalanche effect, which occurs in particular in the forward direction when a transistor dissipates a maximum of power at low current strength and high voltage, or in the reverse direction when a power transistor is used to exert a switching function on an inductive load. The use of such transistors is restricted with respect to power when the voltage becomes high.

In order to improve the behavior of such a transistor with respect to secondary breakdown it is necessary to control the temperature of the crystal and for that purpose maintain the gain of the transistor and the current distribution.

One of the objects of the invention is to improve the secondary breakdown behavior in the forward direction of a transistor, the emitter zone of which is formed by two regions of which one is low doped. It is the object of the invention to extend the field of application of the transistor at high power levels to higher voltages by eliminating the occurrence of secondary breakdown with low current and strong dissipation.

For that purpose the invention controls crystal temperature by using a defocalization effect occuring even with low current strength. In fact it is known that with high current strength a voltage drop occurs in the base zone of the transistor between the central part of said base zone which adjoins the part of the emitter zone situated nearest to the emitter contact, and the peripheral part of the base zone adjoining the base contact (or possibly a base contact zone). The said voltage drop causes a reduction of the polarization of the emitter-base junction in the central part and hence a concentration of the current injected by the emitter zone at its periphery; the said concentration is termed the crown effect or defocalization effect.

It is to be noted that the above expressions "central part" and "peripheral part" by no means define the shape and the dimensions of the said regions and that certain regions, for example, may comprise several islands or may show a comb-like configuration and may possibly form interdigitated configurations with other regions. As regards this latter case it is assumed that the central part corresponds inter alia to the axis of the digits of the "comb" forming the emitter zone, while the peripheral part of an emitter zone or of a base zone corresponds to the part which is situated nearest to the base contact zone.

In the above-described transistors, the said crown effect manifests itself only at high currents; the current injected by the peripheral part of the emitter zone is then channelled to the base contact zones and passes a low-doped emitter region. This may give rise to a distribution of the heat dissipation which at high currents permits using the transistor at full power. The invention permits obtaining a similar result at low currents and high voltages, while at the same time the invention improves the secondary breakdown behavior of the transistor in the reverse direction.

According to the invention, a transistor is characterized in that a central base region of the second conductivity type having a higher doping than the base zone is present in the central part of the emitter zone, extends into the second semiconductor layer and is surrounded by the parts of the emitter-base junction and of the junction between the surface region and the third layer extending parallel to the surface.

Semiconductor regions having a doping concentration higher than $10^{17}$ atoms/cm$^3$ and preferably higher than $10^{18}$ atoms/cm$^3$ are generally to be considered as "highly doped", whereas semiconductor regions having a doping concentration lower than $10^{17}$ atoms/cm$^3$ and preferably lower than $10^{16}$ atoms/cm$^3$ are considered to be "low-doped".

The highly doped central base region forms a transistor region where the current gain of the transistor is substantially equal to zero; in the said region the high doping causes a strong recombination. Thus in all cases and even at low current level, a base current exists which is comparatively important and a voltage drop occurs in the base zone; the polarization difference between the central part of the peripheral part is such that the polarization in the central part is very weak and that the intensity of the current can become larger only at the periphery of the emitter zone; this produces a defocalization effect which occurs even with low current strength. Since the highly doped emitter surface region is situated at a given distance from the base contact zone, the current injected at the periphery of the emitter zone must pass over this distance the low-doped emitter zone layer which has a comparatively high resistance; this resistance increases with temperature and in this manner ensures a temperature control which eliminates the danger of a thermal avalanche.

A first embodiment of the transistor according to the invention is characterized in that the central base region extends up to the surface and that an electrode is provided on the surface contacting both this region and the surface region of the first conductivity type.

In this manner the said electrode is connected to the base zone via the highly doped central base region, while a current can constantly circulate in the base zone. The emitter zone does not inject current in the central short-circuited part and can inject current in the base zone only at a given distance from the said central region. The defocalization effect obtained in this manner eliminates the danger of secondary breakdown. In addition, with the said structure a parallel resistance is obtained across the emitter-base junction which is integrated along the whole length of the periphery of the emitter zone. The said resistance is used, for example, in the case of an amplifier circuit of the Darlington type between the emitter zone and the base zone of the power output transistor so as to avoid in this manner amplification of the leakage current of the input transistor by the said output transistor.

A second preferred embodiment of the transistor according to the invention is characterized in that the central base region is separated from the surface by a part of the surface region of the first conductivity type.

The resulting short-circuit and the parallel resistance across the emitter-base junction in the above described embodiment are avoided in this manner when the said resistance is not useful. Numerous recombinations occur in the central highly doped base region and the amplification is very small, while in the base zone a voltage drop occurs which causes the defocalization effect and eliminates the danger of a thermal avalanche.

The transistor usually comprises a collector zone which is formed by an n+ conductive silicon substrate (the "+" sign denotes a high doping concentration) which is covered by an n-conductive epitaxial layer, a base zone which is formed in a p-conductive low-doped epitaxial layer and which in addition comprises at least a highly doped base contact zone and a p+ conductive highly doped central base region which have both been obtained via diffusion, and an emitter zone which is formed in an n-conductive low-doped epitaxial layer portion which is bounded by the base contact zone and which comprises, at a given distance from said contact zone, an n+-conductive highly doped region adjoining the said p+ conductive highly doped region, the said base contact zone and the highly doped emitter region being diffused from the surface of the epitaxial emitter layer.

In this preferred structure, the low-doped region of the emitter zone shows all qualities which are due to the epitaxial nature of the material, namely a low concentration of crystal defects and a good homogeneity of the characteristic properties. This is also the case for the epitaxial part of the base zone.

According to a preferred embodiment of the transistor according to the invention, taking into account the electrical properties which the transistor is to obtain, the distance "d" between the highly doped region of the emitter zone on the one hand and the base contact zone on the other hand is maintained as large as possible. In fact, said distance is decisive of the occurrence of secondary breakdown. It has been found on the one hand that the said distance "d" must be large so as to obtain a sufficiently high value for the resistance of the low-doped emitter layer portion which is traversed by the current which is injected by the peripheral part of the emitter zone in the base zone part which is situated near the base contact zone, and on the other hand that the increase of the said resistance with the temperature permits a better temperature control. With a large distance "d", the defocalization has its full effect and the thermal avalanche phenomenon is eliminated. According to a particular embodiment of the invention, the distance "d" is at least 40 microns and the emitter zone and the base contact zone of the transistor show an interdigitated comb-like structure in which the "digits" of the interdigitated emitter configuration formed in this manner have a total width which, measured between two walls of the base contact zone, is at least 200 microns.

A method of manufacturing a transistor according to the invention is characterized in that the first, second and third semiconductor layers are obtained successively by epitaxial growth, that the base contact zone and the central base region of the second conductivity type are then formed in the same diffusion step, and that the highly doped surface region of the emitter zone is then provided by local diffusion. As a result of this, the central highly doped base region may be obtained without an extra doping step.

A first preferred embodiment of the method is characterized in that the surface region is provided in the form of a zone surrounding the highly doped central base region.

A second preferred embodiment of the method is characterized in that the surface region is provided by diffusion in a surface portion comprising the central base region, a surface-adjoining part of said region obtaining the first conductivity type.

By diffusion via a mask opening, an emitter surface region is obtained in this manner which on the one hand comprises a highly doped peripheral part which is bounded externally by the low-doped epitaxial emitter layer and on the other hand a central part which is partly compensated by the impurities which provide the conductivity type of the base zone, said central part being in contact with a highly doped central base region. In these circumstances the central part of the emitter-base junction on either side of and in particular on the side of the base zone shows a high doping concentration, which reduces the current amplification in this region to substantially zero; the current injected in the base zone passes, in the emitter zone, mainly the peripheral part the resistance of which is comparatively large; the crown effect obtained in this manner provides an optimum behavior of the transistor with respect to secondary breakdown.

The invention may be applied to power transistors to be used at comparatively high voltages and may be applied in particular to transistors having an epitaxial multilayer structure the emitter zone of which comprises two regions the doping concentrations of which differ considerably, both with planar structure and with mesa structure.

The invention will now be described in greater detail with reference to the drawing, in which:

FIG. 3 is a partial diagrammatic sectional view taken on the line CD in FIG. 4 of another embodiment of a transistor according to the invention; and FIG. 4 is a plan view prior to the formation of the electrodes of the transistor shown in FIG. 3.

Figure 1:
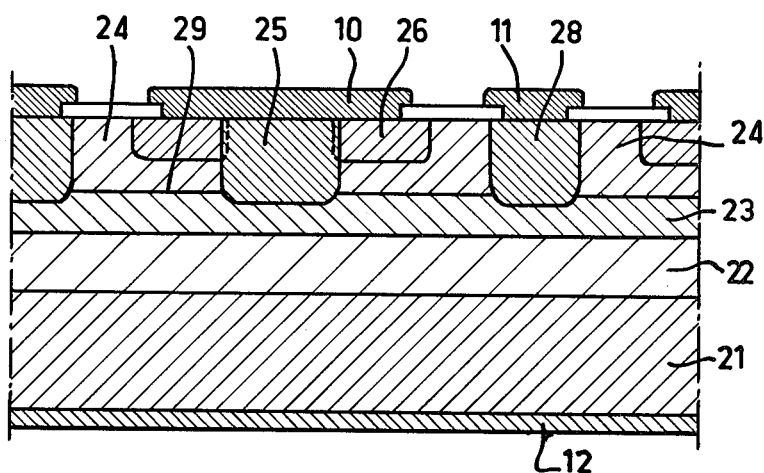
FIG. 1 is a partial diagrammatic cross-sectional view taken on the line AB in FIG. 2 of a first embodiment of a transistor according to the invention.
Figure 2:
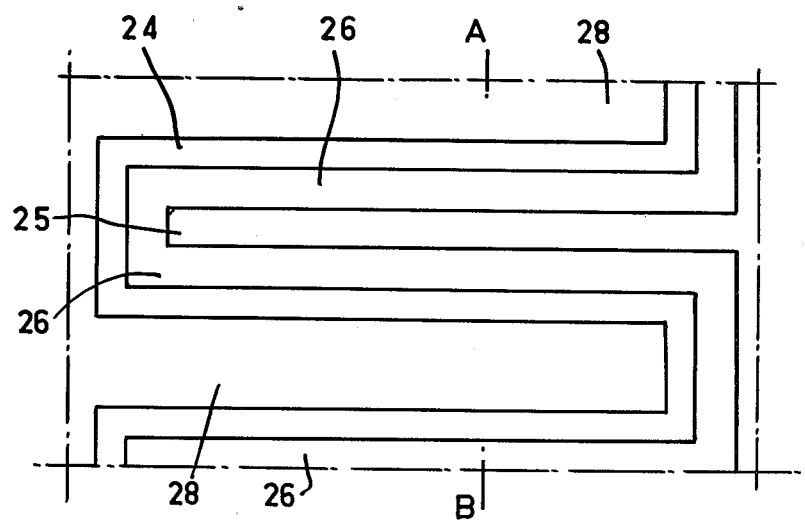
FIG. 2 is a partial plan view prior to the formation of the electrodes of the transistor shown in FIG. 1.

The transistor shown in FIGS. 1 and 2 comprises an n+-type conductive silicon substrate 21 which is covered with a first n-conductive epitaxial layer 22 the thickness of which is 60 microns and the resistivity of which is 30 Ohm.cm. The substrate 21 and the first epitaxial layer 22 constitute the collector zone of the transistor which also comprises a metal electrode 12 which is provided on the lower surface of the substrate. The base zone of the said transistor is constituted by a second p-conductive epitaxial layer 23 the thickness of which is 10 microns and the resistivity of which is approximately 5 Ohm.cm. In order to form the emitter zone, a third n-conductive epitaxial surface layer 24 the resistivity of which is 5 Ohm.cm and the thickness of which is 8 microns is provided across the layer 23. The base zone 23 is connected to an electrode 11 via a base contact zone 28 which passes through the layer 24 and which is strongly p+ conductive, the sheet resistance of the zone 28 being approximately 10 Ohm per square; the said zone 28 is obtained by diffusion from the surface. Present within the emitter zone is a region 25 extending through the layer 24 and being strongly p+ conductive; the said region 25 is obtained by the same diffusion which formed the zone 28. In each "digit" of the emitter zone the width of the region 25 is from 60 microns to 80 microns, while the width of the emitter zone digit measured between the two walls of the zone 28 is approximately 450 microns to 500 microns. On either side of the region 25 the emitter zone comprises an n+ conductive localized surface region 26 which is highly doped and which is diffused in the layer 24 down to a depth of 3 microns, said region 26 having a sheet resistance of 2 Ohm per square. The central base region is surrounded by the parts of the emitter-base junction 29 and of the junction between the surface region 26 and the third layer 24 extending parallel to the surface. The region 26 has a distance of at least 60 microns to the base contact zone 28. An electrode 10 contacts the surface of the region 26 of the emitter zone and the region 25 which is connected to the base zone and provides a short-circuit which forms a parallel resistance across the emitter-base junction 29.

The transistor described with reference to FIGS. 1 and 2 may be used as an output transistor of an amplifier of the Darlington type. When the periphery of the emitter zone is approximately 30 mm to 40 mm, such a transistor can dissipate more than 150 watts, while a maximum voltage $BV_{CEO}$ of approximately 500 Volts between the collector and the emitter with floating base can be achieved without the occurrence of secondary breakdown.

The transistor shown in FIGS. 3 and 4 comprises an n+ conductive silicon substrate 31 which is covered by an n conductive epitaxial layer 32 the thickness of which is 15 microns and the resistivity of which is 4 Ohm.cm. The substrate 31 and the layer 32 constitute the collector zone of the transistor which also comprises a metal electrode 45 provided in the lower surface of the substrate. The base zone of the transistor is constituted by a p-conductive epitaxial layer 33 the thickness of which is 12 microns and the resistivity of which is 6 to 8 Ohm.cm. In order to form the emitter zone of the transistor, an n-conductive epitaxial surface layer 34 the resistivity of which is 4 to 5 Ohm.cm and the thickness of which is 5 microns was provided on the surface 33. The epitaxial layer (base) 33 is connected to an electrode 42 via a base contact zone 35 which passes through the p+ conductive layer 34, the zone 35 obtained via diffusion from the surface having a sheet resistance of at most 100 Ohm. per square. According to the axes 49 of the layer part 34 which is situated between the "digits" of the contact zone 35, an n+ conductive localized surface zone 36-37 is diffused in the layer 34 down to a depth of 3 microns. The said zone 36-37 is highly doped and the sheet resistance thereof is 5 Ohm per square. The central part 37 of the zone 36-37 is less deep than the peripheral part 36 and adjoins a strongly p+ conductive underlying central base zone 43 which extends down to the base layer 33 and the characteristics of which are the same as those of the lower part of the zone 35. An electrode 44 contacts the surface of the surface region 36 of the emitter zone. The central part 37 is in direct contact with the p+ conductive highly doped zone 43; the amplification in the central part of the emitter-base junction is substantially equal to zero. On the other hand, the peripheral part of the emitter 36-38 has an N/N+ junction 40. The distance between the zone 36 and the zone 35 is at least 50 microns. It is exclusively the peripheral part of the emitter zone which emits and the defocalization effect occurs at any current strength. The transistor operates up to a voltage which is at least equal to 100 volts and dissipates its maximum power without the occurrence of secondary breakdown.

It is to be noted that the invention is not restricted to the embodiments described. In particular, all conductivity types may be replaced by their opposite conductivity types and other semiconductor materials and insulating layers may be used.

What is claimed is:

1. A power transistor with three active zones having a semiconductor body comprising a first semiconductor layer of a first conductivity type forming at least a part of the collector zone of the transistor, a second layer of the second conductivity type which adjoins said first layer and which forms the base zone, an emitter zone which comprises a part of a third semiconductor layer of the first conductivity type which adjoins the second layer and a more highly doped surface region of the first conductivity type present therein, the part of the third layer forming the emitter zone being bounded by and contacting a highly doped base contact zone of the second conductivity type which connects the second layer to the surface, said surface region being spaced apart from the base contact zone, and means for causing said transistor to exhibit a defocalization effect in operation at any current level, said means comprising a central base region of the second conductivity type having a higher doping than that of the base zone and located in the central part of the emitter zone, said central base region extending into the second semiconductor layer and the surface layer and being surrounded by parts of both the emitter-base junction and the junction between the surface region and the third layer which extend parallel to the surface.

2. A transistor as claimed in claim 1, wherein the central base region extends up to the surface and an electrode is provided on the surface which contacts both the central base region and the surface region of the first conductivity type.

3. A transistor as claimed in claim 1, wherein the central base region is separated from the surface by a part of the surface region of the first conductivity type.

4. A transistor as claimed in claim 1, wherein the emitter zone and the base contact zone are interdigitated, the distance between the surface region of the first conductivity type and the base contact zone is at least 40 microns and the emitter digits have an overall width of at least 200 microns.

* * * * *